(12) United States Patent
Hiyoshi et al.

(10) Patent No.: US 9,647,072 B2
(45) Date of Patent: May 9, 2017

(54) SILICON CARBIDE SEMICONDUCTOR DEVICE

(71) Applicant: Sumitomo Electric Industries, Ltd., Osaka-shi (JP)

(72) Inventors: Toru Hiyoshi, Osaka (JP); Takeyoshi Masuda, Osaka (JP); Keiji Wada, Osaka (JP); Takashi Tsuno, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/441,022

(22) PCT Filed: Nov. 6, 2013

(86) PCT No.: PCT/JP2013/079992
§ 371 (c)(1),
(2) Date: May 6, 2015

(87) PCT Pub. No.: WO2014/097760
PCT Pub. Date: Jun. 26, 2014

(65) Prior Publication Data
US 2015/0303266 A1  Oct. 22, 2015

(30) Foreign Application Priority Data

Dec. 18, 2012 (JP) .................. 2012-275754

(51) Int. Cl.
*H01L 29/16* (2006.01)
*H01L 29/66* (2006.01)
(Continued)

(52) U.S. Cl.
CPC ...... *H01L 29/1608* (2013.01); *H01L 21/3065* (2013.01); *H01L 29/045* (2013.01);
(Continued)

(58) Field of Classification Search
CPC ............. H01L 29/1608; H01L 21/3065; H01L 29/7802; H01L 29/42364; H01L 29/045; H01L 29/66068
See application file for complete search history.

(56) References Cited

U.S. PATENT DOCUMENTS

2009/0026497 A1  1/2009  Shimoida et al.
2011/0180814 A1  7/2011  Harada et al.
(Continued)

FOREIGN PATENT DOCUMENTS

CN  102652361 A  8/2012
CN  102652362 A  8/2012
(Continued)

OTHER PUBLICATIONS

Machine translation of JP 2000-200791 A.*
(Continued)

*Primary Examiner* — Dale E Page
*Assistant Examiner* — Vincent Wall
(74) *Attorney, Agent, or Firm* — Venable LLP; Michael A. Sartori; F. Brock Riggs

(57) ABSTRACT

A silicon carbide semiconductor device has a silicon carbide substrate, a gate insulating film, and a gate electrode. Silicon carbide substrate includes a first impurity region having a first conductivity type, a well region being in contact with the first impurity region and having a second conductivity type which is different from the first conductivity type, and a second impurity region separated from the first impurity region by the well region and having the first conductivity type. The gate insulating film is in contact with the first impurity region and the well region. The gate electrode is in contact with the gate insulating film and is arranged opposite to the well region with respect to the gate insulating film. A specific on-resistance at a voltage which is half a gate
(Continued)

driving voltage applied to the gate electrode is smaller than twice the specific on-resistance at the gate driving voltage.

5 Claims, 9 Drawing Sheets

(51) Int. Cl.
  *H01L 29/04*  (2006.01)
  *H01L 29/423*  (2006.01)
  *H01L 29/78*  (2006.01)
  *H01L 21/3065*  (2006.01)
  *H01L 21/04*  (2006.01)

(52) U.S. Cl.
  CPC .. *H01L 29/42364* (2013.01); *H01L 29/66068* (2013.01); *H01L 29/7802* (2013.01); *H01L 21/0475* (2013.01); *H01L 29/7813* (2013.01)

(56) References Cited

U.S. PATENT DOCUMENTS

| | | | |
|---|---|---|---|
| 2011/0278595 A1* | 11/2011 | Nishiguchi | B32B 13/04 257/77 |
| 2012/0091472 A1 | 4/2012 | Sasaki et al. | |
| 2012/0199850 A1 | 8/2012 | Honaga et al. | |
| 2012/0228640 A1* | 9/2012 | Masuda | H01L 29/045 257/77 |
| 2012/0280270 A1 | 11/2012 | Ryu et al. | |
| 2012/0309195 A1 | 12/2012 | Masuda | |
| 2012/0326166 A1* | 12/2012 | Masuda | H01L 21/049 257/77 |
| 2013/0009171 A1* | 1/2013 | Harada | H01L 21/02002 257/77 |
| 2013/0109110 A1* | 5/2013 | Sasaki | H01L 21/049 438/14 |
| 2013/0112996 A1 | 5/2013 | Masuda | |
| 2013/0292702 A1* | 11/2013 | Horii | H01L 21/28158 257/77 |

FOREIGN PATENT DOCUMENTS

| | | | | |
|---|---|---|---|---|
| CN | 102812537 A | 12/2012 | | |
| EP | 2 015 363 A | 1/2009 | | |
| EP | 2221859 A1 | 8/2010 | | |
| EP | 2357671 A1 | 8/2011 | | |
| JP | 2000-200791 A | 7/2000 | | |
| JP | 2002-261275 A | 9/2002 | | |
| JP | 2002-261295 A | 9/2002 | | |
| JP | 2007-258465 A | 10/2007 | | |
| JP | 2009-182240 A | 8/2009 | | |
| JP | WO 2011118104 A1 * | 9/2011 | ....... | H01L 21/02002 |
| JP | WO 2012014645 A1 * | 2/2012 | ........... | H01L 21/049 |
| TW | 201214707 A * | 4/2012 | ........... | H01L 29/045 |
| WO | WO-2010/116887 A1 | 10/2010 | | |
| WO | WO-2011/108768 A1 | 9/2011 | | |
| WO | WO-2011/129150 A1 | 10/2011 | | |
| WO | 2012/017798 A1 | 2/2012 | | |
| WO | 2012/017958 A1 | 2/2012 | | |
| WO | WO-2012/017796 A1 | 2/2012 | | |

OTHER PUBLICATIONS

International Search Report in PCT International Application No. PCT/JP2013/079992, dated Feb. 10, 2014.
Hull et al., "Performance of 60A, 1200V 4H-SiC DMOSFETs," Materials Science Forum, vols. 615-617, pp. 749-752 (2009).
Notification of First Office Action in counterpart Chinese Patent Application No. 201380056368.3, dated Oct. 9, 2016.
Notice of Grounds of Rejection in Japanese Patent Application No. 2012-275754, mailed Jun. 14, 2016.
Notification of Reasons for Submission in Japanese Patent Application No. JP 2012-275754, mailed Jan. 26, 2016.
Harada et al., "4.3 mΩcm2, 1100 V 4H-SiC Implantation and Epitaxial MOSFET," Materials Science Forum vols. 527-529, 2006.
"Power MOSFET," Toshiba Corporation, Semiconductor Division, Semiconductor Sales Management Division, Mar. 1994.
"Reliability of Power Semiconductor Device," Mitsubishi Semiconductor Data Book 1997, Mitsubishi Electric Corporation, Semiconductor Sales and Marketing Department, Dec. 1996.
"Characteristics of power MOSFET and application to switching power source," NEC Semiconductor Application Technology Division, Power MOSFET Data Book, Mar. 30, 1994.
Notice of Grounds of Rejection in Japanese Patent Application No. 2012-275754 dated Dec. 8, 2015.
Extended European Search Report in counterpart European Patent Application No. 13865084.1, dated Nov. 21, 2016.
Decision to Grant in counterpart Japanese Patent Application No. JP 2012-275754, dated Dec. 6, 2016.

* cited by examiner

SILICON CARBIDE SEMICONDUCTOR DEVICE

TECHNICAL FIELD

The present invention relates to a silicon carbide semiconductor device, and more particularly to a silicon carbide semiconductor device including a gate electrode.

BACKGROUND ART

In recent years, in aim of enabling a higher breakdown voltage, a lower loss, and a use under a high-temperature environment for a semiconductor device such as a MOSFET (Metal Oxide Semiconductor Field Effect Transistor), employment of silicon carbide as a material constituting the semiconductor device is now under way. Silicon carbide is a wide band gap semiconductor having a wider band gap as compared to silicon which has been conventionally and widely used as a material constituting a semiconductor device. Therefore, the employment of silicon carbide as a material constituting a semiconductor device can achieve a higher breakdown voltage and a reduced on-resistance of the semiconductor device. Moreover, a semiconductor device employing silicon carbide as a material has an advantage that lowering of the properties in the use under a high-temperature environment is smaller as compared to a semiconductor device employing silicon as a material.

For example, Brett A. Hull et al., "Performance of 60A, 1200V 4H—SiC DMOSFETs", Materials Science Forum, Vols. 615-617, 2009, pp 749-752 (NPD 1) discloses a MOSFET which has an n-type drift region, a pair of well regions, and a gate insulating film formed on a silicon carbide substrate. The document described above discloses that a value of a specific on-resistance of the MOSFET is 9 $m\Omega cm^2$ at VGS=20V.

CITATION LIST

Non Patent Document

NPD 1: Brett A. Hull et al., "Performance of 60A, 1200V 4H—SiC DMOSFETs", Materials Science Forum, Vols. 615-617, 2009, pp 749-752

SUMMARY OF INVENTION

Technical Problem

However, although the specific on-resistance of the MOSFET described above is low which is 9 $m\Omega cm^2$ at VGS=20V, the switching characteristic is not sufficient.

Therefore, an object of the present invention is to provide a silicon carbide semiconductor device capable of improving the switching characteristic.

Solution to Problem

As a result of diligent studies, the inventors obtained the following knowledge and achieved the present invention. Typically, a specific on-resistance is measured, for example, at a gate driving voltage with a gate voltage of approximately 18V. However, even when the specific on-resistance is small at the gate driving voltage with a maximum gate voltage, if the specific on-resistance is large at a voltage with a gate voltage which is smaller than the gate driving voltage, a current becomes difficult to flow at the time when the low voltage is applied. In other words, when the specific on-resistance is small at the low gate voltage, the specific on-resistance becomes small also in a transient region where the gate voltage changes from a minimum value to a maximum value, so that the switching loss becomes small as a consequence.

Therefore, reducing the specific on-resistance at the gate driving voltage with a maximum gate voltage as well as the specific on-resistance at the voltage in the transient region until the gate voltage reaches the gate driving voltage (in other words, the voltage which is lower than the gate driving voltage) is effective to improve the switching characteristic.

A silicon carbide semiconductor device according to the present invention has a silicon carbide substrate, a gate insulating film, and a gate electrode. The silicon carbide substrate includes a first impurity region having a first conductivity type, a well region being in contact with the first impurity region and having a second conductivity type which is different from the first conductivity type, and a second impurity region separated from the first impurity region by the well region and having the first conductivity type. The gate insulating film is in contact with the first impurity region and the well region. The gate electrode is in contact with the gate insulating film and is arranged opposite to the well region with respect to the gate insulating film. A specific on-resistance at a voltage which is half a gate driving voltage applied to the gate electrode is smaller than twice the specific on-resistance at the gate driving voltage. It should be noted that the gate driving voltage is a gate voltage which is defined in a specification or the like of a silicon carbide semiconductor device and required for driving of the silicon carbide semiconductor device.

According to the silicon carbide semiconductor device of the present invention, the specific on-resistance at the voltage which is half the gate driving voltage applied to the gate electrode is smaller than twice the specific on-resistance at the gate driving voltage. Since it can reduce the specific on-resistance in the transient region of the gate voltage, the switching characteristic of the silicon carbide semiconductor device can be improved.

Preferably, in the silicon carbide semiconductor device described above, a threshold voltage of a gate voltage is greater than or equal to 5% of the gate driving voltage. Accordingly, a normally-off silicon carbide semiconductor device can be obtained.

Preferably, in the silicon carbide semiconductor device described above, the gate driving voltage is greater than or equal to 10V and less than or equal to 20V. Accordingly, the switching characteristic of the silicon carbide semiconductor device at the gate driving voltage of greater than or equal to 10V and less than or equal to 20V can be improved.

Preferably, in the silicon carbide semiconductor device described above, the specific on-resistance is a value measured at a room temperature. Accordingly, the switching characteristic of the silicon carbide semiconductor device can be improved at the room temperature.

Preferably, in the silicon carbide semiconductor device described above, a surface of the well region in contact with the gate insulating film includes a first plane having a plane orientation of {0-33-8}. Accordingly, a channel resistance at the surface of the well region in contact with the gate insulating film can be reduced. Therefore, the specific on-resistance can be reduced.

Preferably, in the silicon carbide semiconductor device described above, the surface includes the first plane microscopically. The surface further includes a second plane having a plane orientation of {0-11-1} microscopically.

Accordingly, the channel resistance at the surface of the well region in contact with the gate insulating film can be further reduced. Therefore, the specific on-resistance can be further reduced.

Preferably, in the silicon carbide semiconductor device described above, the first plane and the second plane of the surface include a complex plane having a plane orientation of {0-11-2}. Accordingly, the channel resistance at the surface of the well region in contact with the gate insulating film can be further reduced. Therefore, the specific on-resistance can be further reduced.

Preferably, in the silicon carbide semiconductor device described above, the surface has an off angle of 62°±10° with respect to a {000-1} plane macroscopically. Accordingly, the channel resistance at the surface of the well region in contact with the gate insulating film can be further reduced. Therefore, the specific on-resistance can be further reduced.

Advantageous Effects of Invention

As being apparent from the description above, according to the present invention, a silicon carbide semiconductor device capable of improving the switching characteristic can be provided.

DESCRIPTION OF EMBODIMENT

Figure 1:
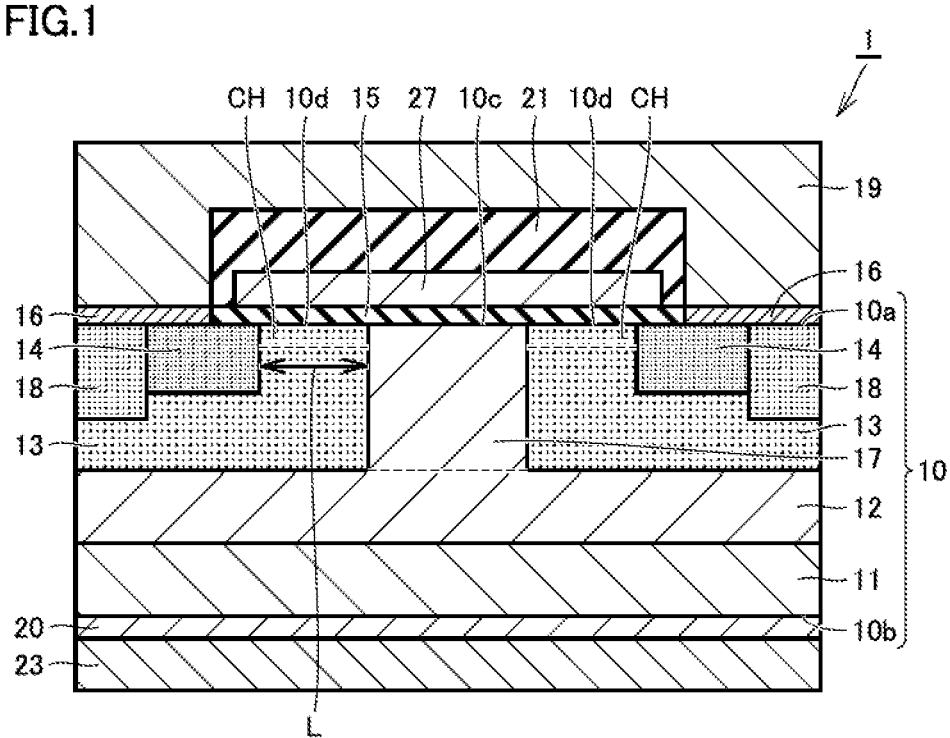
FIG. 1 is a cross-cross-sectional view schematically representing a configuration of a silicon carbide semiconductor device according to one embodiment of the present invention.

Hereinafter, an embodiment of the present invention will be described with reference to the drawings. In the drawings below, the same or corresponding elements have the same reference characters allotted, and description thereof will not be repeated. Regarding the crystallographic description in the specification, an individual orientation is indicated by [ ], and a group orientation is indicated by < >, and an individual plane is indicated by ( ), and a group plane is indicated by { }. Moreover, while a negative index should be indicated by adding "-" (bar) above numeral in view of the crystallography, a negative sign is allotted before numeral in the specification. For description of angles, a system having a total orientation angles of 360 degrees is used.

Firstly, a configuration of a MOSFET as a silicon carbide semiconductor device according to one embodiment of the present invention will be described.

Referring to FIG. 1, a MOSFET 1 according to the present embodiment mainly includes a silicon carbide substrate 10, a gate insulating film 15, a gate electrode 27, source electrodes 16, and a drain electrode 20.

Silicon carbide substrate 10 is made of, for example, hexagonal crystal silicon carbide of polytype 4H and has a first main surface 10a and a second main surface 10b which are opposite to each other. Silicon carbide substrate 10 mainly includes a base substrate 11, a drift region 12, a first impurity region 17, well regions 13, second impurity regions 14, and p+ regions 18.

Base substrate 11 is, for example, a substrate made of hexagonal crystal silicon carbide and having a conductivity type of n-type (first conductivity type). Base substrate 11 includes impurities such as N (nitrogen) at a high concentration. An impurity concentration of nitrogen or the like contained in base substrate 11 is, for example, approximately $1.0 \times 10^{18}$ cm$^{-3}$.

Drift region 12 and first impurity region 17 are epitaxial layers made of hexagonal crystal silicon carbide and having an n-type. First impurity region 17 is a region sandwiched by a pair of well regions 13. The impurities contained in drift region 12 and first impurity region 17 are, for example, nitrogen. The impurity concentrations in drift region 12 and first impurity region 17 are lower than the impurity concentration in base substrate 11. The impurity concentrations of nitrogen contained in drift region 12 and first impurity region 17 are, for example, approximately $7.5 \times 10^{15}$ cm$^{-3}$.

Well region 13 is a region having a p-type (second conductivity type) which is different from the n-type. The impurities contained in well regions 13 are, for example, Al (aluminum), B (boron), or the like. Preferably, the impurity concentration of aluminum contained in well region 13 is greater than or equal to approximately $1 \times 10^{17}$ cm$^{-3}$ and less than or equal to approximately $1 \times 10^{18}$ cm$^{-3}$.

Second impurity region 14 is a region having the n-type (first conductivity type). The second impurity regions are separated from first impurity region 17 and drift region by well regions 13. Moreover, second impurity regions 14 include first main surface 10a and are formed inside of well region 13 so as to be surrounded by well regions 13. Second impurity regions 14 contain impurities such as P (phosphorus) at a concentration of, for example, approximately $1 \times 10^{20}$ cm$^{-3}$. The concentrations of the impurities contained in second impurity regions 14 are higher than the impurities contained in drift region 12.

In well regions 13 sandwiched between first impurity region 17 and second impurity regions 14, the regions in contact with first main surface 10a are channel regions CH. Along a length of channel region CH in the direction parallel to first main surface 10a, a distance between first impurity region 17 and second impurity regions 14 is referred to as a channel length L. Preferably, the channel length is greater than or equal to approximately 0.8 μm and less than or equal to 1.0 μm.

P+ regions 18 are regions having the p-type (second conductivity type) P+ regions 18 are in contact with first main surface 10a and well regions 13 and are formed so as to penetrate near a center of second impurity regions 14. P+ regions 18 contain impurities such as aluminum or boron at a concentration of, for example, approximately $1 \times 10^{20}$ cm$^{-3}$. The concentration of impurities contained in p+ regions 18 is higher than the concentration of impurities contained in well regions 13.

Gate insulating film 15 is formed in contact with first impurity region 17 so as to extend from an upper surface of one second impurity region 14 to an upper surface of the other second impurity region 14. Gate insulating film 15 is made of, for example, silicon dioxide Preferably, a thickness of gate insulating film 15 (a distance of the gate insulating film along a normal direction of first main surface 10a) is greater than or equal to approximately 45 nm and less than or equal to approximately 55 nm.

Gate electrode 27 is arranged in contact with gate insulating film 15 so as to extend from above one second impurity region 14 to above the other second impurity region 14. Gate electrode 27 is made of conductive material such as polysilicon or aluminum.

Source electrodes 16 are arranged to be in contact with second impurity regions 14 and p+ regions 18 on first main surface 10a. Moreover, source electrodes 16 are in contact with gate insulating film 15 on second impurity region 14. Source electrodes 16 include, for example, titanium (Ti) atoms, aluminum (Al) atoms, and silicon (Si). Source electrodes 16 are ohmic contact electrodes containing Ti, Al, and Si, so that they are in contact with both of the p-type silicon carbide region and n-type silicon carbide region with a low contact resistance.

Drain electrode 20 is formed to be in contact with second main surface 10b of silicon carbide substrate 10. This drain electrode 20 may have the same configuration as, for example, source electrodes 16 described above, or may be made of other material such as Ni capable of being in ohmic contact with base substrate 11. Accordingly, drain electrode 20 is electrically connected to base substrate 11. A pad electrode 23 is arranged to be in contact with drain electrode 20.

An interlayer insulating film 21 is formed so as to be in contact with gate insulating film 15 and surround gate electrode 27. Interlayer insulating film 21 is made of, for example, silicon dioxide which is an insulator. A source interconnection 19 surrounds interlayer insulating film 21 and is in contact with source electrodes 16 above first main surface 10a of silicon carbide substrate 10. Source interconnection 19 is made of conductive material such as Al and electrically connected to second impurity regions 14 through source electrodes 16.

First main surface 10a of silicon carbide substrate 10 includes a first surface 10c which is a surface of first impurity region 17 and second surfaces 10d which are surfaces of channel regions CH. Second surfaces 10d are surfaces of well regions 13 in contact with gate insulating film 15. First main surface 10a of silicon carbide substrate 10 preferably has a special surface which will be described below. More preferably, the surfaces of well regions 13 in contact with gate insulating film 15 (second surfaces 10d) have the special surface.

Figure 7:
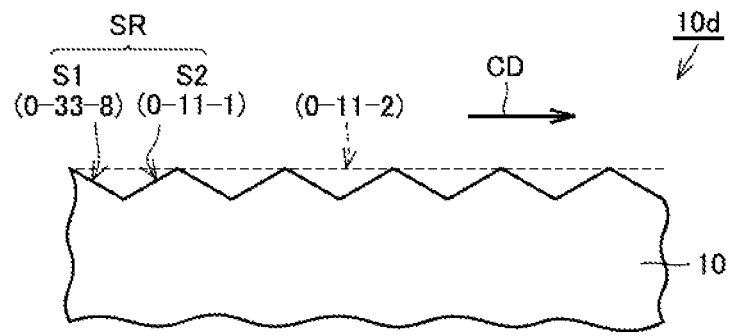
FIG. 7 is a partial cross-sectional view schematically representing a fine structure of a main surface of a silicon carbide substrate of the silicon carbide semiconductor device according to one embodiment of the present invention.

The special surface will be described. As shown in FIG. 7, second surface 10d having the special surface includes a plane S1 (first plane) having a plane orientation of (0-33-8). More preferably, second surface 10d includes plane S1 microscopically. Further, second surface 10d includes plane S2 (second plane) having a plane orientation of (0-11-1) microscopically. Herein, the "microscopically" means that it is to the extent of considering at least a dimension of approximately twice an atom gap. As a method of observing such a microscopic structure, a TEM (Transmission Electron Microscope) can be used for example.

Preferably, plane S1 and plane S2 of second surface 10d constitute a complex plane SR having a plane orientation of (0-11-2). In other words, complex plane SR is constituted by cyclic repetition of planes S1 and S2. Such a cyclic structure can be observed by, for example, the TEM or an AFM (Atomic Force Microscopy). In this case, complex plane SR has an of angle of 62° with respect to the (000-1) plane macroscopically Herein, the "macroscopically" means that a fine structure having a dimension approximately equal to an atom gap is disregarded. For measurement of such a macroscopic off angle, a method using a general X-ray diffraction may be used Preferably, a channel direction CD which is a direction of a flow of a carrier on second surface 10d (a direction parallel to first main surface 10a) is along the direction of the cyclic repetition described above.

Next, a detailed structure of complex plane SR will be described.

Figure 8:
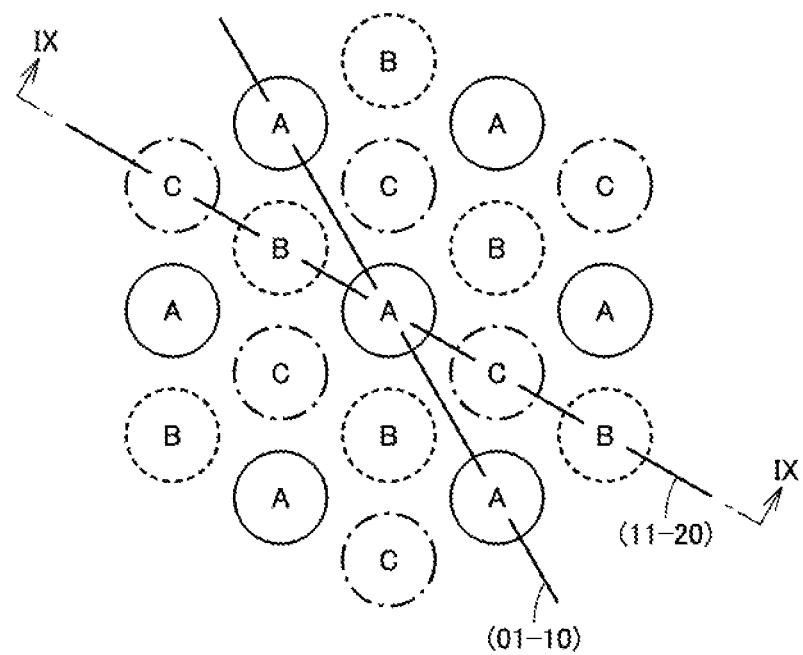
FIG. 8 represents a crystal structure of a (000-1) plane in a hexagonal crystal of polytype 4H.

Generally, when the silicon carbide single crystal of polytype 4H is viewed from the (000-1) plane, as shown in FIG. 8, Si atoms (or C atoms) are provided repeatedly in the order of an atom in an A-layer (the solid line in the drawing), an atom in a B-layer located below (the broken line in the drawing), an atom in a C-layer located below (the dashed line in the drawing), and an atom in the B-layer located below (not illustrated). In other words, four layers ABCB are included in one cycle, and a cyclic layered structure of ABCBABCBABCB and so on is provided.

Figure 9:
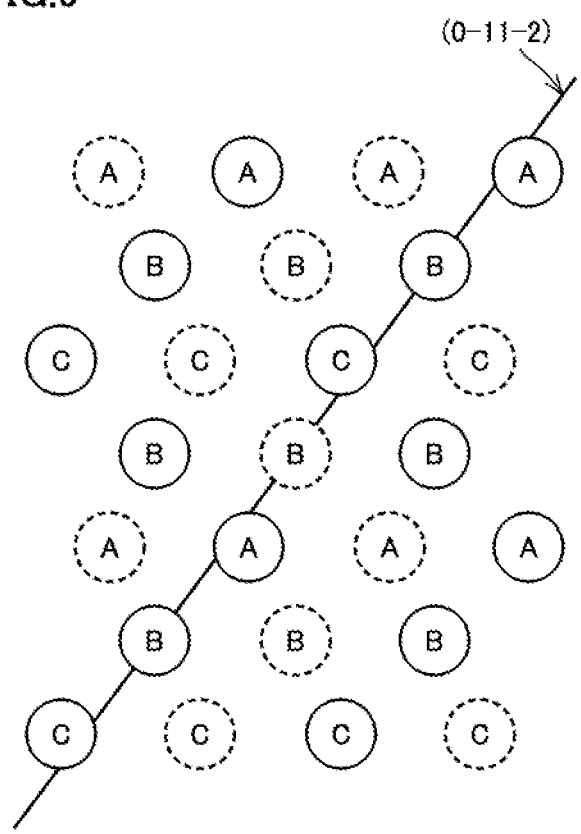
FIG. 9 represents a crystal structure of a (11-20) plane taken along the line segment IX-IX of FIG. 8.

As shown in FIG. 9, on the (11-20) plane (the cross section taken along the IX-IX line of FIG. 8), atoms in each of the four layers ABCB constituting one cycle are not aligned to be completely along the (0-11-2) plane. In FIG. 9, the (0-11-2) plane is shown to pass through the positions of atoms in the B-layer. In this case, it can be seen that each of the atoms in the A-layer and C-layer is deviated from the (0-11-2) plane. Therefore, even when the macroscopic plane orientation of the surface of the silicon carbide single crystal, in other words, the plane orientation for the case where the structure of the atom level is disregarded is limited to the (0-11-2) plane, this surface may take various structures microscopically.

Figure 10:
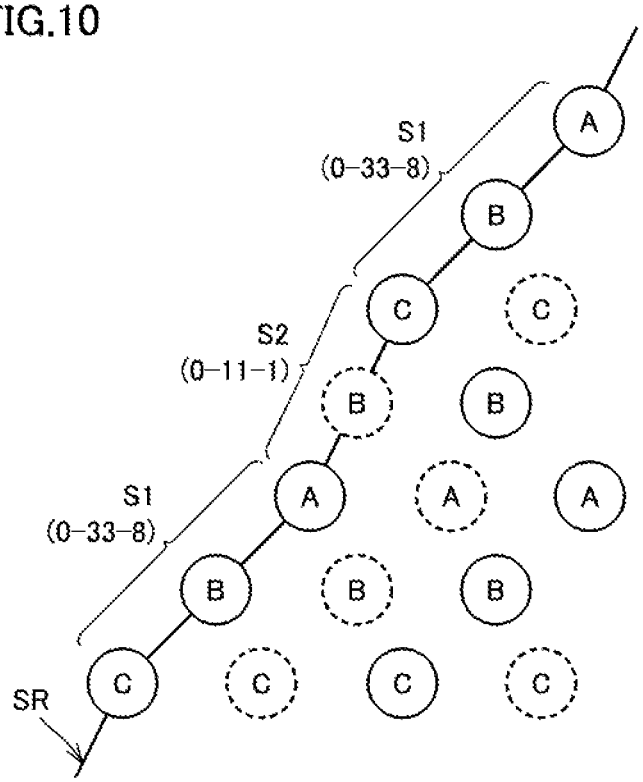
FIG. 10 represents in the (11-20) plane a crystal structure in the vicinity of the surface of the complex plane of FIG. 7.

As shown in FIG. 10, complex plane SR is constituted by alternately providing plane S1 having the plane orientation of (0-33-8) and plane S2 connected to plane S1 and having a plane orientation which is different from the plane orientation of plane S1. The length of each of plane S1 and plane S2 is twice the atom gap of Si atoms (or C atoms). The averaged plane of plane S1 and plane S2 corresponds to the (0-11-2) plane (FIG. 9).

Figure 11:
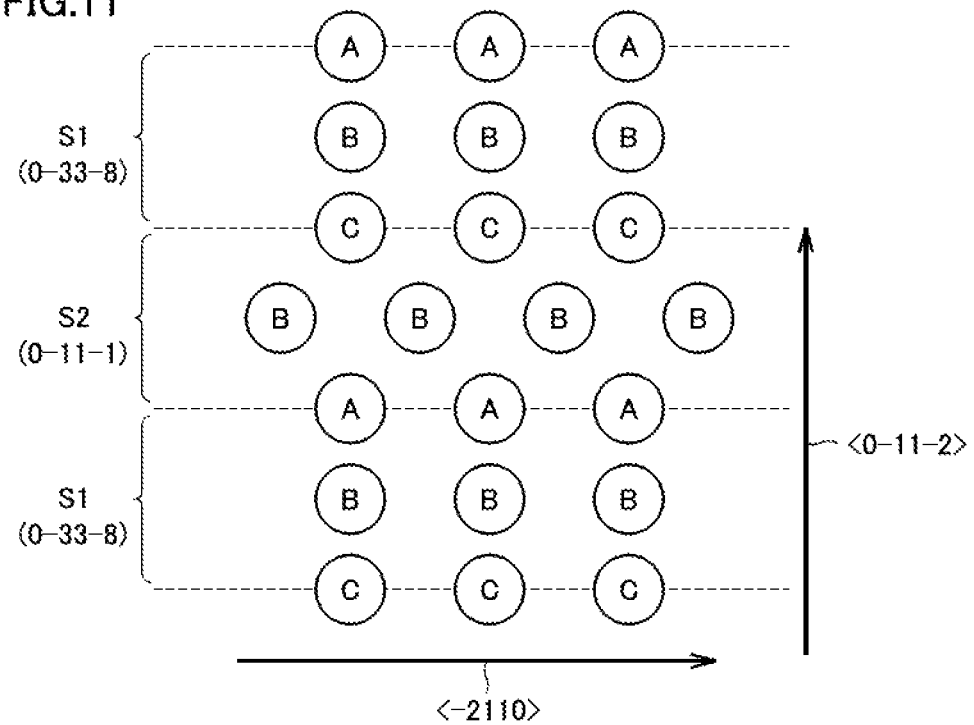
FIG. 11 represents the complex plane of FIG. 7 viewed from a (01-10) plane.

As shown in FIG. 11, when complex plane SR is viewed from the (01-10) plane, the single crystal structure cyclically includes a structure partially equivalent to cubic crystal (the part of plane S1). Specifically, complex plane SR is configured by alternately providing plane S1 having a plane orientation of (001) in the structure equivalent to the cubic crystal described above and plane S2 being connected to plane S1 and having a plane orientation which is different from the plane orientation of plane S1. Constituting the surface with a plane having the plane orientation (001) in the structure which is equivalent to the cubic crystal (plane S1 in FIG. 8) and a plane connected to this plane and having a plane orientation which is different from this plane orientation (plane S2 in FIG. 8) in this manner can be also made in a polytype other than 4H.

Figure 12:
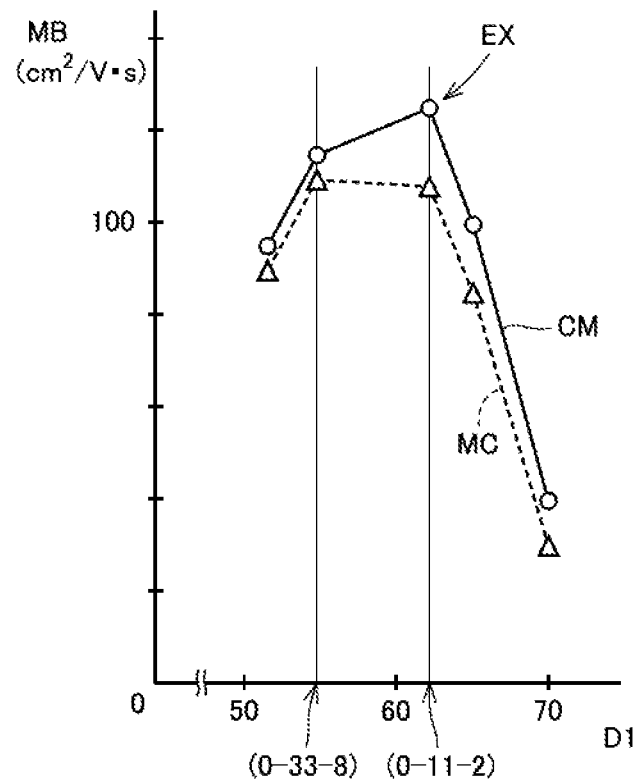
FIG. 12 is a graph representing one example of a relationship between an angle of a macroscopically viewed channel surface with respect to the (000-1) plane and a channel mobility for each of the case where thermal etching is performed and the case where the thermal etching is not performed.

Next, referring to FIG. 12, a relationship between the crystal surface of second surface 10d and a mobility MB of the channel surface will be described. In the graph of FIG. 12, the horizontal axis denotes an angle D1 between a macroscopic plane orientation of second surface 10d having the channel surface and the (000-1) plane, and the vertical axis denotes mobility MB. A plot group CM corresponds to the case where second surface 10d is finished with a special surface by thermal etching, and a plot group MC corresponds to the case where such thermal etching is not performed and second surface 10d is not finished as a special surface.

Mobility MB in plot group MC was maximum when the macroscopic plane orientation of the surface of the channel surface was (0-33-8). The reason for this seems to be because, when the thermal etching is not performed, in other words, when the microscopic structure of the channel surface is not particularly controlled, the macroscopic plane orientation is set to be (0-33-8), so that the probability that the microscopic plane orientation (0-33-8), in other words, the plane orientation (0-33-8) taking into account the atom level is formed became high.

On the other hand, mobility MB in plot group CM became maximum when the macroscopic plane orientation of the surface of the channel surface was (0-11-2) (arrow EX). The reason for this seems to be because, as shown in FIGS. 10 and 11, a large number of planes S1 having the plane orientation of (0-33-8) are arranged densely with regularity through plane S2, so that the ratio of the microscopic plane orientation (0-33-8) in the surface of the channel surface became high.

Figure 13:
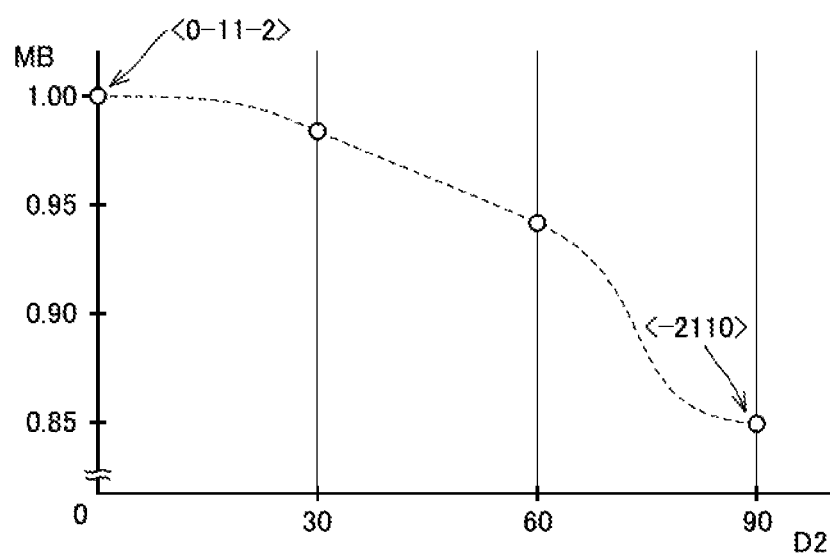
FIG. 13 is a graph representing one example of a relationship between an angle of a channel direction with respect to a <0-11-2> direction and a channel mobility.

It should be noted that mobility MB has an orientation dependence on complex plane SR. In the graph shown in FIG. 13, the horizontal axis denotes an angle D2 between the channel direction and the <0-11-2> direction, and the vertical axis denotes mobility MB (arbitrary unit) of the channel surface. The broken line is added supplementarily for easy viewing of the graph. From this graph, it could be found that angle D2 of channel direction CD (FIG. 7) is preferably greater than or equal to 0° and less than or equal to 600, and more preferably 0° to increase channel mobility MB.

Figure 14:
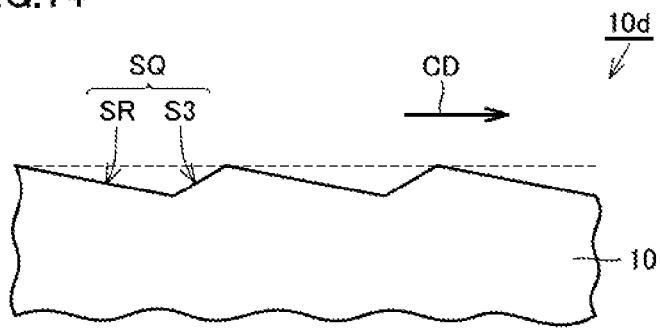
FIG. 14 represents a modified example of FIG. 7.

As shown in FIG. 14, second surface 10d may further include a plane S3 (third plane) in addition to complex plane SR. More specifically, second surface 10d may include a complex plane SQ constituted of cyclically repeated plane S3 and complex plane SR. In this case, an off angle of second surface 10d with respect to the (000-1) plane is deviated from 62° which is an ideal off angle of complex plane SR. This deviation is preferably small, and preferably within the range of ±10°. The surface included in such an angle range includes, for example, the surface having a macroscopic plane orientation of (0-33-8). Such a cyclic structure can be observed by means of, for example, the TEM or AFM.

Next, an operation of MOSFET 1 will be described. In the state where a voltage lower than or equal to a threshold is applied to gate electrode 27, in other words, in the off-state, a region between well regions 13 and drift region 12 located directly below gate insulating film 15 attains a reverse bias and thus a non-conductive state. On the other hand, as a positive voltage is applied to gate electrode 27, an inversion layer is formed in channel regions CH near locations of well regions 13 in contact with gate insulating film 15. Consequently, second impurity regions 14 and drift region 12 are electrically connected, and a current flows between source electrodes 16 and drain electrode 20. A value of a gate voltage provided at a beginning of the current flow between source electrode 16 and drain electrode 20 is referred to as a threshold voltage.

A specific on-resistance at a half of the voltage of the gate driving voltage applied to gate electrode 27 of MOSFET 1 according to the present embodiment is smaller than twice the specific on-resistance at the gate driving voltage. Preferably, the gate driving voltage is greater than or equal to 10V and less than or equal to 20V. A thickness of gate insulating film 15 in the case where the gate driving voltage is 10V is greater than or equal to 25 nm and less than or equal to 35 nm, and a thickness of gate insulating film 15 in the case where the gate driving voltage is 20V is greater than or equal to 50 nm and less than or equal to 55 nm. Preferably, the specific on-resistance is a value measured at a room temperature.

The threshold voltage of the gate voltage is preferably greater than 0V, and more preferably greater than or equal to 4V. Preferably, the threshold voltage of the gate voltage is greater than or equal to 5% of the gate driving voltage. For example, when the gate driving voltage is 18V, the threshold of the gate voltage is greater than or equal to 0.9V.

Next, a method for manufacturing MOSFET 1 according to one embodiment of the present invention will be described.

Figure 2:
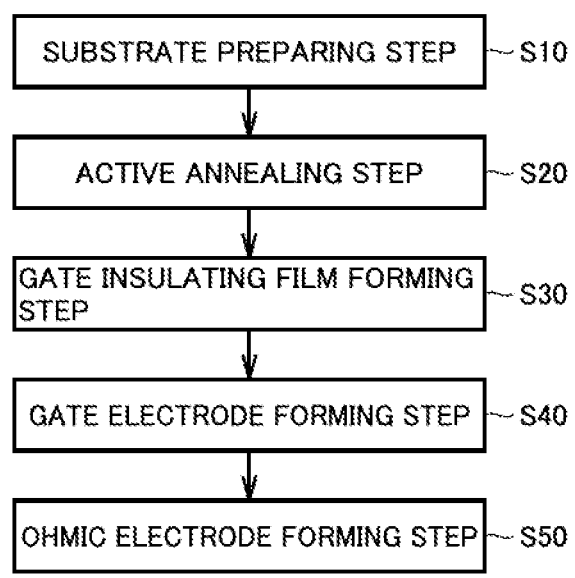
FIG. 2 is a flowchart schematically representing a method fir manufacturing a silicon carbide semiconductor device according to one embodiment of the present invention.
Figure 3:
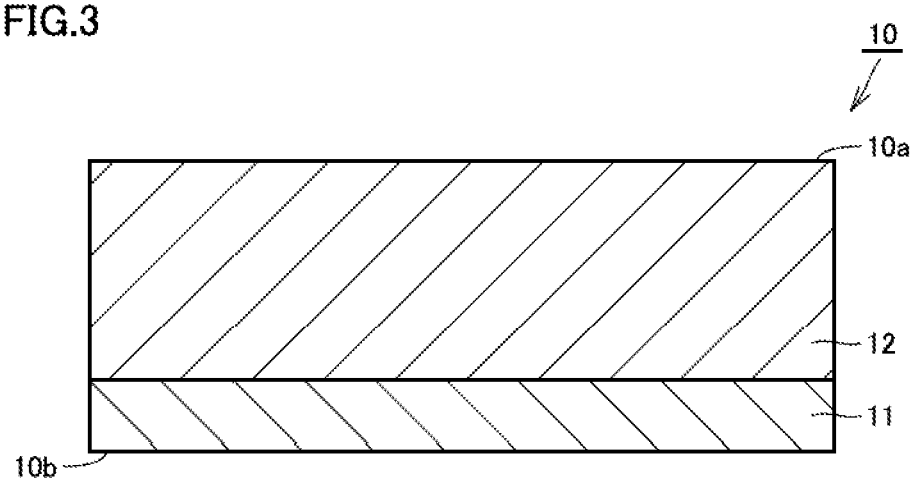
FIG. 3 is a cross-sectional view schematically representing a first step of the method for manufacturing a silicon carbide semiconductor device according to one embodiment of the present invention.

Referring to FIG. 3, firstly, silicon carbide substrate 10 is prepared by the step of preparing a substrate (S10 in FIG. 2). Specifically, drift region 12 is formed by an epitaxial growth on one main surface of base substrate 11 made of hexagonal crystal silicon carbide. The epitaxial growth can be conducted by employing, for example, mixture gas of $SiH_4$ (silane) and $C_3H_8$ (propane) as source gas. At this time, for example, N (nitrogen) is introduced as impurities. Accordingly, drift region 12 is formed which contains impurities at a concentration lower than the impurities contained in base substrate 11.

Silicon carbide substrate 10 has first main surface 10a and second main surface 10b opposite to each other. First main surface 10a of silicon carbide substrate 10 is, for example, a {0-33-8} plane. Preferably, first main surface 10a includes first plane S1 having the plane orientation of {0-33-8}. Moreover, preferably, first main surface 10a includes first plane S1 microscopically. Further, first main surface 10a includes second plane S2 having the plane orientation of {0-11-1} microscopically. Further, preferably, first plane S1 and second plane S2 of first main surface 10a includes a complex plane having a plane orientation of {0-11-2}. Further, preferably, first main surface 10a has an off angle of 62°±10° with respect to the {000-1} plane macroscopically.

Silicon carbide substrate 10 having first main surface 10a described above is formed, for example, by heating silicon carbide substrate 10 while supplying reactive gas to first main surface 10a. The reactive gas may react with silicon carbide under heating, and preferably includes halogen gas, and for example includes chlorine gas. The reactive gas may further include oxygen gas. Moreover, the reactive gas may include carrier gas. As the carrier gas, for example, nitrogen gas, argon gas, or helium gas can be used. The heating of silicon carbide substrate 10 is performed, for example, at a temperature higher than or equal to approximately 700° C. and lower than or equal to approximately 1000° C. This thermal etching renders first main surface 10a of silicon carbide substrate 10 to be a plane having the plane orientation described above.

Next, for example, the CVD (Chemical Vapor Deposition) forms an oxide film made of silicon dioxide on first main surface 10a of silicon carbide substrate 10. Then, after a resist is applied on the oxide film, exposure and development are performed, so that a resist layer having an opening in a region corresponding to the desired shape of well region 13 is formed. Then, with use of the resist layer as a mask, for example, the oxide film is partially removed by an RIE (Reactive Ion Etching), so that a mask layer made of an oxide film having an opening is formed on drift region 12.

Figure 4:
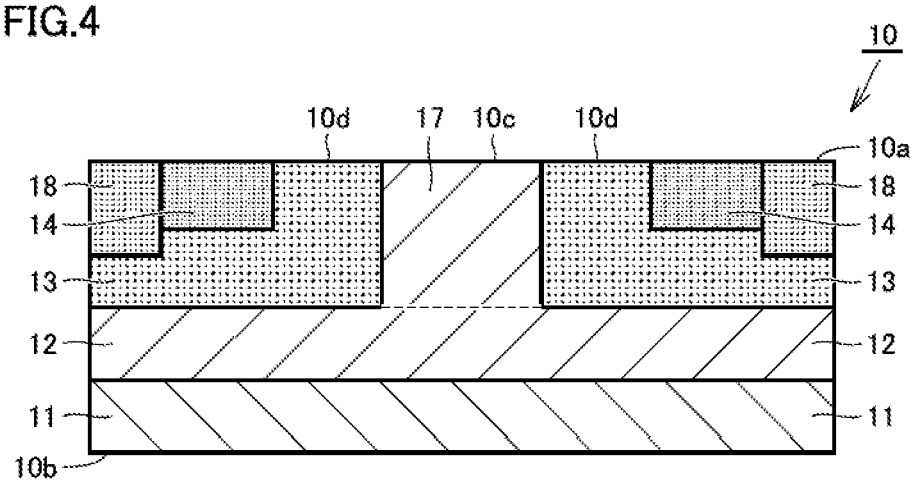
FIG. 4 is a cross-sectional view schematically representing a second step of the method for manufacturing a silicon carbide semiconductor device according to one embodiment of the present invention.

Referring to FIG. 4, the ion implantation process is performed. In the ion implantation process, ion is implanted to first main surface 10a of silicon carbide substrate 10, so that well region 13, second impurity regions 14, and p+ regions 18 are formed. Specifically, upon removing the resist layer, the mask layer is used as a mask to perform ion implantation of impurities such as Al with respect to drift region 12, so that well regions 13 are formed. Moreover, n-type impurities such as P (phosphorus) are introduced to drift region 12 by ion implantation, so that second impurity regions 14 are formed. Next, impurities such as Al and B are introduced to drift region 12 by ion implantation, so that p+ regions 18 are formed.

The pair of well regions 13 are formed, so that first impurity region 17 sandwiched between the pair of well regions 13 is formed. First main surface 10a includes a first surface 10c which is a surface of first impurity region 17 and second surfaces 10d which are the main surfaces of well regions 13 sandwiched between first impurity region 17 and second impurity regions 14.

Next, the active annealing step (S20: FIG. 2) is performed. A thermal treatment for activating the impurities introduced by the ion implantation is performed. Specifically, silicon carbide substrate 10 to which the ion implantation is performed is, for example, heated to approximately 1700° C. under the Ar (argon) atmosphere and retained for approximately 30 minutes.

Figure 5:
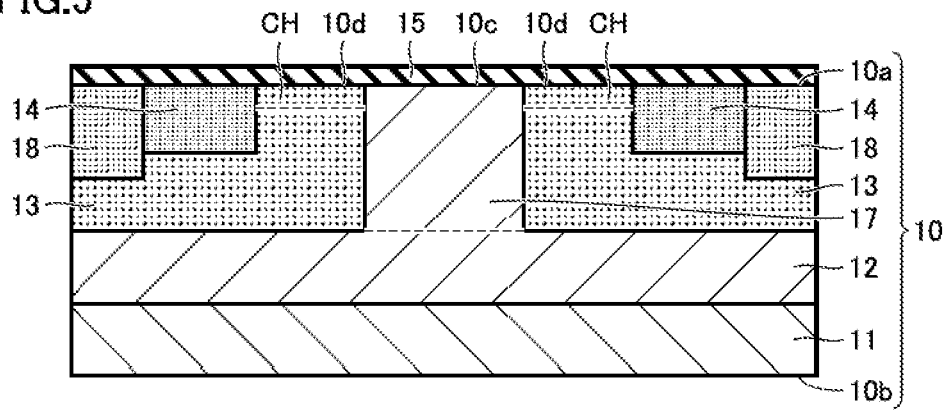
FIG. 5 is a cross-sectional view schematically representing a third step of the method for manufacturing a silicon carbide semiconductor device according to one embodiment of the present invention.
Figure 6:
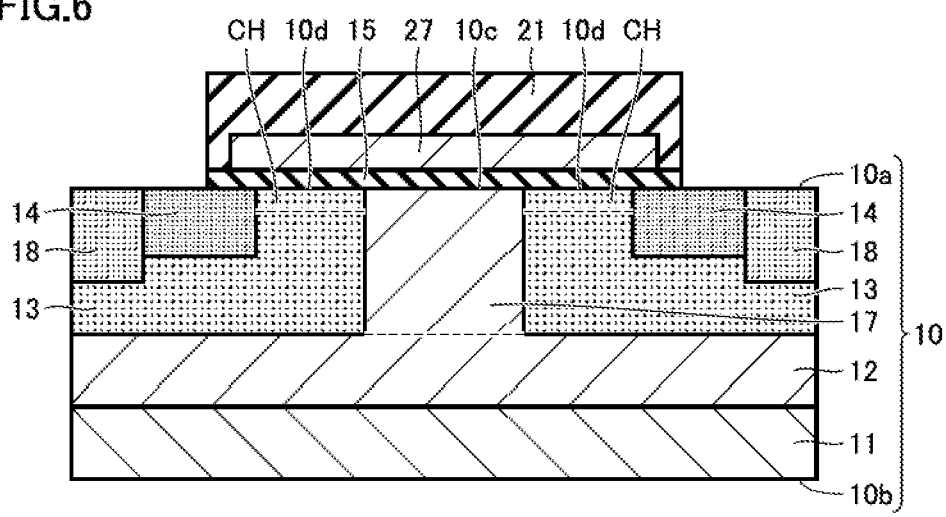
FIG. 6 is a cross-sectional view schematically representing a fourth step of the method for manufacturing a silicon carbide semiconductor device according to one embodiment of the present invention.

Next, the gate insulating film forming step (S30: FIG. 2) is performed. Specifically, referring to FIG. 5, firstly, silicon carbide substrate 10 having ion implantation region formed thereon is thermally oxidized. The thermal oxidation can be performed by, for example, heating to approximately 1300° C. in the oxygen atmosphere and retaining for approximately 40 minutes. Accordingly, gate insulating film 15 made of silicon dioxide is formed on first main surface 10a of silicon carbide substrate 10.

Next, the gate electrode forming step (S40: FIG. 2) is performed. In this step, gate electrode 27 made of conductive material such as polysilicon, aluminum, or the like is formed so as to extend from one second impurity region 14 to the other second impurity region 14 and in contact with gate insulating film 15. When polysilicon is employed as a material of gate electrode 27, the polysilicon may include phosphorus at a high concentration exceeding $1 \times 10^{20}$ cm$^{-3}$. After that, interlayer insulating film 21 made of, for example, silicon dioxide is formed so as to cover gate electrode 27.

Next, an ohmic electrode forming step (S50: FIG. 2) is performed. Specifically, a resist pattern is formed from which, for example, a part of p+ regions 18 and second impurity regions 14 are exposed, and a metal film containing, for example, Si atoms, Ti atoms, and Al atoms is formed on the entire substrate by, for example, sputtering After that, the resist pattern is, for example, lifted oft so that a metal film in contact with gate insulating film 15 and in contact with p+ regions 18 and second impurity regions 14 is formed. After that, the metal film is heated to, for example, approximately 1000° C., so that source electrode 16 is formed which is in ohmic contact with silicon carbide substrate 10. Moreover, drain electrode 20 is formed which is in contact with base substrate 11 of silicon carbide substrate 10. Then, MOSFET 1 shown in FIG. 1 is completed.

The configuration having the n-type and p-type switched with each other in the embodiment described above may be used. Moreover, in the present embodiment, a planar type MOSFET was described as an example of a silicon carbide semiconductor device. However, the silicon carbide semiconductor device may be a trench type MOSFET. Further, the silicon carbide semiconductor device may be an IGBT (Insulated Gate Bipolar Transistor) or the like.

Next, effects of the method for manufacturing MOSFET 1 according to the present embodiment will be described.

With MOSFET 1 according to the present embodiment, a specific on-resistance in a voltage of half the gate driving voltage applied to gate electrode 27 is smaller than twice a specific on-resistance in the gate driving voltage. Accordingly, since the specific on-resistance in the transient region of the gate voltage can be reduced, the switching characteristic of MOSFET 1 can be improved.

Moreover, according to MOSFET 1 of the present embodiment, the threshold voltage of the gate voltage is greater than or equal to 5% of the gate driving voltage. Accordingly, a normally-off MOSFET 1 can be obtained.

Further, according to MOSFET 1 of the present embodiment, the gate driving voltage is greater than or equal to 10V and less than or equal to 20V. Accordingly, the switching characteristic of MOSFET 1 at the gate driving voltage of greater than or equal to 10V and less than or equal to 20V can be improved.

Further, according to MOSFET 1 of the present embodiment, the specific on-resistance is a value measured at a room temperature. Accordingly, the switching characteristic of MOSFET 1 at the room temperature can be improved.

Further, according to MOSFET 1 of the present embodiment, second surfaces 10d in contact with gate insulating film 15 of well regions 13 include first plane S1 having a plane orientation of {0-33-8}. Accordingly, the channel resistance in second surfaces 10d of well regions 13 in contact with gate insulating film 15 can be reduced. Accordingly, the specific on-resistance can be reduced.

Further, according to MOSFET 1 of the present embodiment, second surfaces 10d include first plane S1 microscopically. Second surfaces 10d further includes second plane S2 having a plane orientation of {0-11-1} microscopically.

Accordingly, the channel resistance in second surfaces 10d of well regions 13 in contact with gate insulating film 15 can be further reduced. Accordingly, the specific on-resistance can be further reduced.

Further, according to MOSFET 1 of the present embodiment, first plane S1 and second plane S2 of second surfaces 10d include complex plane SQ having a plane orientation of 10-11-2). Accordingly, the channel resistance in second surfaces 10d of well regions 13 in contact with gate insulating film 15 can be further reduced. Accordingly, the specific on-resistance can be further reduced.

Further, according to MOSFET 1 of the present embodiment, second surfaces 10d have an off angle of 62°±10° with respect to the {000-1} plane. Accordingly, the channel resistance in second surfaces 10d of well region 13 in contact with gate insulating film 15 can be further reduced. Accordingly, the specific on-resistance can be further reduced.

EXAMPLE 1

A relationship between a specific on-resistance and a gate voltage for each of MOSFETs 1 according to Invention Example 1 and Comparative Example 1 was investigated.

Firstly, MOSFETs 1 according to Invention Example 1 and Comparative Example 1 were manufactured in a manner which is the same as the method described in the first embodiment except for the following points. First main surfaces 10a of silicon carbide substrates 10 for MOSFETs 1 of Invention Example 1 and Comparative Example 1 were set to have a (0-33-8) plane and a (0001) plane, respectively. The impurity concentrations of well regions 13 of MOSFETs 1 of Invention Example 1 and Comparative Example 1 were set to be $5 \times 10^{17}$ cm$^{-3}$ and $3 \times 10^{16}$ cm$^{-3}$, respectively. Moreover, a channel length for each of MOSFETs 1 of Invention Example 1 and Comparative Example 1 was set to be 1 μm. Further, a thickness of each of gate insulating films 15 of MOSFETs 1 of Invention Example 1 and Comparative Example 1 was set to be 45 nm.

Next, a specific on-resistance for each of MOSFETs 1 of Invention example 1 and Comparative Example 1 manufactured in the method described above was measured while changing a gate voltage. The result is shown in FIG. 15.

Figure 15:
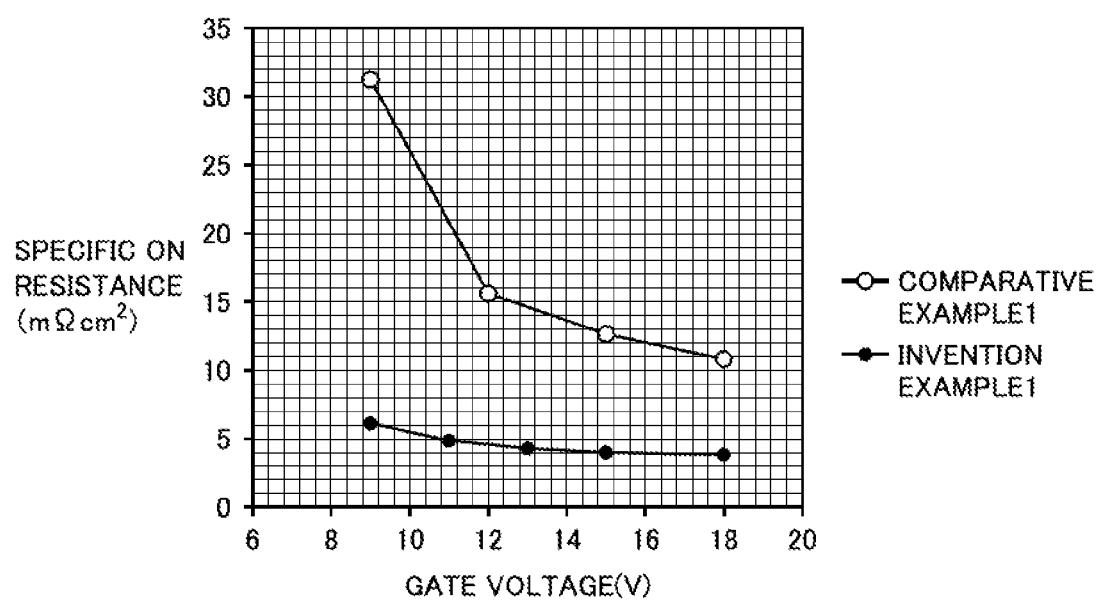
FIG. 15 represents a relationship between a specific on-resistance and a gate voltage.

In FIG. 15, the horizontal axis denotes a gate voltage (V), and the vertical axis denotes a specific on-resistance (mΩcm$^2$). As shown in FIG. 15, the specific on-resistance of Comparative Example 1 was about 11 mΩcm$^2$ when the gate voltage was 18V (gate driving voltage), and was about 31 mΩcm$^2$ when the gate voltage was 9V (a voltage of a half of the gate driving voltage). In Comparative Example, the specific resistance for the voltage (9V) of half the gate driving voltage applied to gate electrode 27 was about 2.8 times greater than the specific on-resistance for the gate driving voltage (18V). On the other hand, the specific on-resistance of Invention Example 1 was about 4 mΩcm$^2$ when the gate voltage was 18V, and was about 6 mΩcm$^2$ when the gate voltage was 9V. The specific on-resistance for a voltage (9V) of half the gate driving voltage applied to gate electrode 27 was 1.5 times greater than the specific on-resistance for the gate driving voltage (18V).

Comparative Example 1, as compared with Invention Example 1, had a greater gate voltage dependency of the specific on-resistance. Therefore, when the gate voltage has a low value of about 9V, Comparative Example 1 had a high specific on-resistance of about 31 mΩcm$^2$, and on the other hand, also when the gate voltage had a low value of about 9V, Invention Example 1 could maintain a low specific on-resistance of about 6 mΩcm$^2$.

From the description above, it has been confirmed that, in MOSFET 1 of Invention Example 1, the specific on-resistance at a voltage (9V) which is half the gate driving voltage applied to gate electrode 27 is less than twice the specific on-resistance at the gate driving voltage (18V).

It is considered that the difference in the gate voltage dependency of the specific on-resistances in Comparative Example 1 and Invention Example 1 as described above is caused by the electric charge trapped at the interface between silicon carbide substrate 10 and gate insulating film 15. In MOSFET 1, the on/off of the current is controlled by applying a gate voltage and forming channel regions CH at the interface between silicon carbide substrate 10 and gate insulating film 15. If the applied gate voltage is not used efficiently for formation of channel regions CH, the specific on-resistance becomes high. Invention Example 1 has an interface state density which is lower than that of Comparative Example 1. Therefore, in Invention Example 1, the applied gate voltage is used efficiently for formation of channel regions CH. As a result, a change in the specific on-resistance becomes smaller with respect to the gate voltage. In other words, since there are many trapped electric charges in Comparative Example 1, the gate voltage is not efficiently used for formation of channel regions CH.

EXAMPLE 2

A relationship between a channel mobility and a gate voltage for each of MOSFETs 1 according to Invention Examples 2, 3 and Comparative Example 2 was investigated.

Firstly, MOSFETs 1 according to Invention Examples 2, 3 and Comparative Example 2 were manufactured in the method which is the same as the method described in the First Embodiment except for the following points. The impurity concentrations of well regions 13 of MOSFETs 1 according to Invention Examples 2, 3 and Comparative Example 2 were set to be $5 \times 10^{17}$ cm$^{-3}$, $1 \times 10^{18}$ cm$^{-3}$, and $5 \times 10^{16}$ cm$^{-3}$, respectively.

Next, the channel mobility for each of MOSFETs 1 of Invention examples 2, 3 and Comparative Example 1 manufactured in the method described above was measured by changing the gate voltage. The result is shown in FIG. 16.

Figure 16:
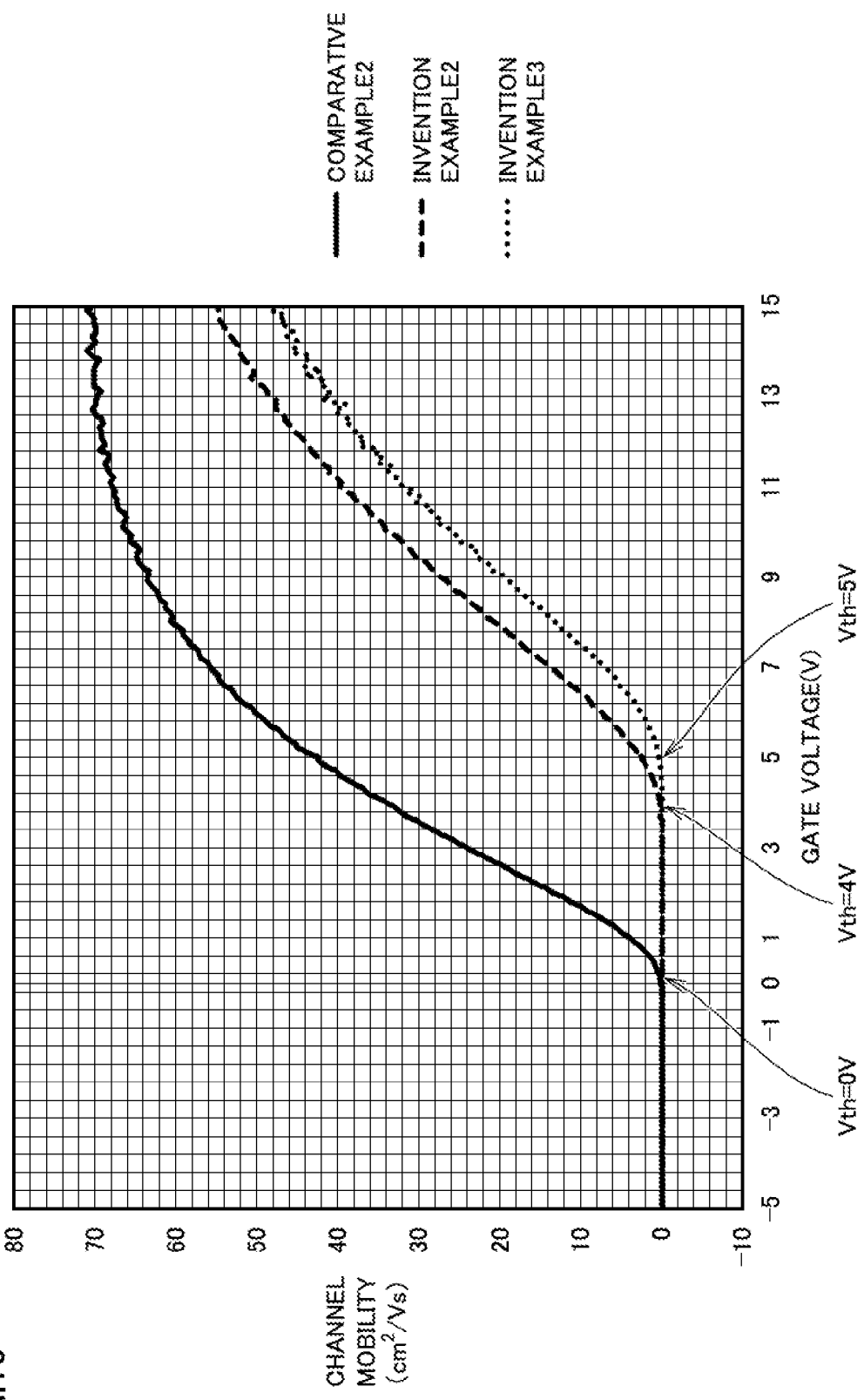
FIG. 16 represents a relationship between a channel mobility and a gate voltage.

In FIG. 16, the horizontal axis denotes the gate voltage (V), and the vertical axis denotes the channel mobility (cm$^2$/Vs). As shown in FIG. 16, a threshold voltage of the MOSFET of Comparative Example 2 was 0V, and the channel mobility at the gate voltage of 15V was 70 cm$^2$/Vs. The threshold voltages of the MOSFETs of Invention Examples 2 and 3 were 4V and 5V, respectively. Moreover, the threshold voltages of the MOSFETs of Invention Examples 2 and 3 were 55 cm$^2$N/Vs and 47 cm$^2$Ns, respectively. When the gate driving voltages of Invention Example 2 and 3 are 15V, the threshold voltages of the gate voltages of Invention Examples 2 and 3 are about 27% and about 33%, respectively.

From the above, it has been confirmed that the threshold voltages of the gate voltages of MOSFETs 1 of Invention Examples 2 and 3 are greater than or equal to 5%.

It is to be understood that the embodiments and examples disclosed herein are only by way of example, and not to be taken by way of limitation. The scope of the present invention is not limited by the description above, but rather by the terms of the appended claims, and is intended to include any modifications within the scope and meaning equivalent to the terms of the claims.

REFERENCE SIGNS LIST

1 MOSFET: 10 silicon carbide substrate; 10a first main surface; 10b second main surface; 10c first surface; 10d second surface: 11 base substrate; 12 drift region; 13 well region; 14 second impurity region; 15 gate insulating film; 16 source electrode; 17 first impurity region: 18 p+ region; 19 source interconnection: 20 drain electrode; 21 interlayer insulating film; 23 pad electrode; 27 gate electrode: S1 first plane, S2 second plane; SQ, SR complex plane.

The invention claimed is:

1. A silicon carbide semiconductor device, comprising:
a silicon carbide substrate including a first impurity region having a first conductivity type, a well region being in contact with said first impurity region and having a second conductivity type which is different from said first conductivity type, and a second impurity region being separated from said first impurity region by said well region and having said first conductivity type;
a gate insulating film being in contact with said first impurity region and said well region; and
a gate electrode being in contact with said gate insulating film and being arranged opposite said to said well region with respect to said gate insulating film,
a specific on-rsistance at a voltage which is half a gate driving voltage applied to said gate electrode being smaller than twice said specific on-resistance at said gate driving voltage,
wherein a surface of said well region in contact with said gate insulating film includes a first plane having a plane orientation of {0-33-8} microscopically and a second plane having a plane orientation of {0-11-1} microscopically, said first plane and said second plane of said surface constituting a complex plane having a plane orientation of {0-11-2}.

2. The silicon carbide semiconductor device according to claim 1, wherein a threshold voltage of a gate voltage is greater than or equal to 5% of said gate driving voltage.

3. The silicon carbide semiconductor device according to claim 1, wherein said gate driving voltage is greater than or equal to 10V and less than or equal to 20V.

4. The silicon carbide semiconductor device according to claim 1, wherein said specific on-resistance is a value measured at a room temperature.

5. A silicon carbide semiconductor device, comprising:
a silicon carbide substrate including a first impurity region having a first conductivity type, a well region being in contact with said first impurity region and having a second conductivity type which is different from said first conductivity type, and a second impurity region being separated from said first impurity region by said well region and having said first conductivity type;
a gate insulating film being in contact with said first impurity region and said well region; and
a gate electrode being in contact with said gate insulating film and being arranged opposite side to said well region with respect to said gate insulating film,
a specific on-resistance at a voltage which is half a gate driving voltage applied to said gate electrode being smaller than twice said specific on-resistance at said gate driving voltage,
wherein a surface of said well region in contact with said gate insulating film includes a first plane having a plane orientation of {0-33-8} microscopically and a second plane having a plane orientation of {0-11-1} microscopically, said first plane and said second plane of said surface constituting a complex plane having a plane orientation of {0-11-2}, and
wherein said surface has an off angle of 62°±10° with respect to a {000-1} plane macroscopically.

* * * * *

UNITED STATES PATENT AND TRADEMARK OFFICE
CERTIFICATE OF CORRECTION

PATENT NO. : 9,647,072 B2
APPLICATION NO. : 14/441022
DATED : May 9, 2017
INVENTOR(S) : Toru Hiyoshi et al.

It is certified that error appears in the above-identified patent and that said Letters Patent is hereby corrected as shown below:

In the Claims

In Claim 1, Column 13, Line 27, "arranged opposite said to said well" should be
-- arranged opposite side to said well --

In Claim 1, Column 13, Line 29, "a specific on-rsistance at a voltage" should be
-- a specific on-resistance at a voltage --

Signed and Sealed this
Fifteenth Day of August, 2017

Joseph Matal
*Performing the Functions and Duties of the*
*Under Secretary of Commerce for Intellectual Property and*
*Director of the United States Patent and Trademark Office*